United States Patent [19]

Henley

[11] Patent Number: 4,983,911
[45] Date of Patent: Jan. 8, 1991

[54] VOLTAGE IMAGING SYSTEM USING ELECTRO-OPTICS

[75] Inventor: Francois J. Henley, Los Gatos, Calif.

[73] Assignee: Photon Dynamics, Inc., San Jose, Calif.

[21] Appl. No.: 481,429

[22] Filed: Feb. 15, 1990

[51] Int. Cl.$^5$ .................. G01R 31/28; G01J 4/00
[52] U.S. Cl. .................. 324/158 R; 324/96; 324/158 D; 324/73.1; 324/158 F; 356/364
[58] Field of Search .......... 324/158 F, 158 R, 158 D, 324/77 K, 96, 73.1; 350/356, 374, 376; 356/397, 364, 367, 368, 2

[56] References Cited

U.S. PATENT DOCUMENTS

| | | | |
|---|---|---|---|
| 4,523,847 | 6/1985 | Bjorklund et al. | 356/364 |
| 4,618,819 | 10/1986 | Mourou et al. | 324/96 |
| 4,758,092 | 7/1988 | Heinrich et al. | 324/158 D |
| 4,855,591 | 8/1989 | Nakamura | 324/96 |
| 4,862,075 | 8/1989 | Choi | 324/158 R |
| 4,875,006 | 10/1989 | Henley et al. | 324/158 R |
| 4,906,922 | 3/1990 | Takahashi et al. | 324/96 |
| 4,910,458 | 3/1990 | Forsyth et al. | 324/158 F |

Primary Examiner—Ernest F. Karlsen
Assistant Examiner—Vinh P. Nguyen
Attorney, Agent, or Firm—Townsend and Townsend

[57] ABSTRACT

A two-dimensional image of the voltage distribution across a surface at a large plurality voltage test points of a panel under test is extracted by illuminating the surface with an expanded, collimated beam of optical energy of a known polarization state through an electro-optic modulator crystal, such as KDP, wherin the crystal is disposed to allow longitudinal probing geometries such that a voltage on the surface of the panel under test causes a phase shift in the optical energy (the electro-optic effect) which can be observed through an area polarization sensor (a polarizing lens) for use to directly produce a two-dimensional spatially-dependent power modulation image directly representative of the spatially corresponding voltage state on the surface of the panel under test. Surface cross-talk is minimized by placing the face of the crystal closer to the panel under test than the spacing of voltage sites in the panel under test. The device may operate in a pass-through mode or in a reflective mode. An etalon may be used to enhance sensitivity.

20 Claims, 2 Drawing Sheets

VOLTAGE IMAGING SYSTEM USING ELECTRO-OPTICS

BACKGROUND OF THE INVENTION

This invention relates to electro-optic sensing of voltage, and more particularly, electro-optic sensing of voltage as a function of position of a large plurality of voltage sources on a surface.

There is a growing need to be able to test and extract voltage information from a voltage-producing surface such as a printed circuit board, an integrated circuit wafer (with or without a package) or a liquid crystal display panel in order to diagnose the integrity of the structure. The present electronic test systems have a technology capable of testing circuit boards or panels (a panel under test or PUT) having a node density not exceeding approximately 100 nodes per square inch. This limitation has been identified as, at least partially, a bandwidth limitation as present electronic test systems of this type can achieve bandwidths of not more of about 200 MHz and/or cannot probe panels with node densities exceeding approximately 100 contact points per square inch.

Certain applications, such as the testing of liquid crystal display panels are best practiced with non-contact sensing techniques such as electro-optic techniques. However, these panels have conductive pixels such as transparent indium tin oxide (ITO), with a thin-film transistor deposited directly on the glass surface and are therefore, considered very fragile. Such panels also may have an additional insulating layer covering the deposited structure, rendering it impossible to place voltage probes at selected positions on the panel. It is therefore impractical to impose contact testing on such panels. Nevertheless, current and projected production methods and strategies demand that each pixel of such a panel be tested for its ability to change voltage state as well an ability to measure voltage under various conditions relative to their voltages. The current state of the art does not provide a test technique for such structures.

It is known to use electro-optic devices for serially testing selected nodes of a voltage producing device. Reference is made to U.S. Pat. Nos. 4,875,006 and 4,862,075. The subject matter of those patents is incorporated herein and made a part hereof. Therein, the use of a single light beam is described to serially access individual sensor nodes using a unique sensor/laser arrangement giving control over a beam of light whereby a Pockels Cell Modulator employs the electro-optic Pockels effect to sense local electric fields produced by voltage on a surface. Such known devices require control of a beam by scanning technology such as an acoustic-optic deflector or an x-y stage. Known systems are thus limited to single beam, serial data extraction.

SUMMARY OF THE INVENTION

According to the invention, a two-dimensional image of the voltage distribution across a surface at a large plurality voltage test points of a panel under test is extracted by illuminating the surface with an expanded, collimated beam of optical energy of a known polarization state through an electro-optic light modulating means such as a KDP crystal or a thin liquid crystal element, wherein the light modulator is disposed to allow longitudinal probing geometries such that a voltage on the surface of the panel under test causes a phase shift in the optical energy (the electro-optic effect) which can be observed through an area polarization sensor (such as a sheet polarizer) for use to directly produce a two-dimensional spatially-dependent power modulation image directly representative of the spatially corresponding voltage state on the surface of the panel under test. Surface cross-talk is minimized by placing the face of the light modulator closer to the panel under test than the spacing of voltage sites in the panel under test. The device may operate in a pass-through mode or in a reflective mode. In a pass-through mode, the image is sensed through a transparent panel under test. In a reflective mode, polarization is observed upon two-pass reflection through the electro-optic light modulator. The signal-to-noise ratio of the electro-optic light modulator can be enhanced by providing etalon means (two parallel reflective surfaces) in the path of the beam such that the polarized beam, upon entering the modulator assembly of the electro-optic light modulator means undergoes a standing wave reflection which increases the sensitivity of the modulator as a function of the finesse of the etalon. Sensitivity is inversely proportional to system bandwidth or time resolved measurements. A camera or other imaging sensor, in connection with a phase retarder and a polarizer, can be used as an instrument to detect the spatial image.

An apparatus operating in accordance with the method of the invention includes an optical energy source, such as a laser, a lens and polarization system for expanding, polarizing and collimating the source optical energy, an electro-optic sensor (light modulator) exhibiting an electro-optic effect, such as the Pockels Effect, when placed in close proximity to the panel under test, a phase retarder and polarization filter or means for establishing polarization of the impinging polarized light beam such that the spatially-dependent power modulation is proportional to the voltage at corresponding positions on the surface of the panel under test, and means for spatially observing a spatially modulated expanded, polarized light beam.

The invention has particular application to noninvasive testing of high-density integrated circuits and testing liquid crystal display (LCD) panels prior to connection with electrical interfaces.

The invention will be better understood by reference to the following detailed description in connection with the accompanying drawings.

DESCRIPTION OF SPECIFIC EMBODIMENTS

Figure 1:
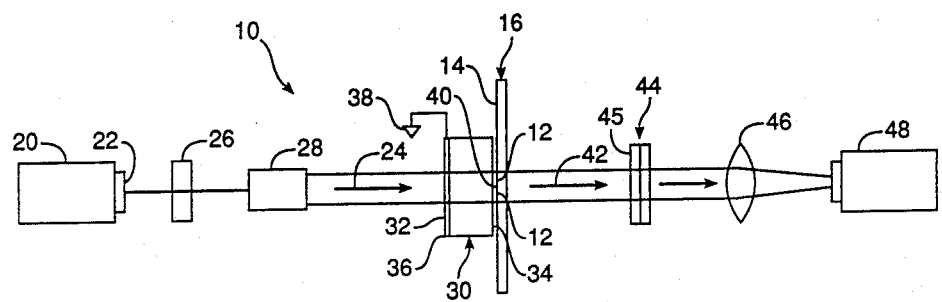
FIG. 1 is a block diagram of a first embodiment of the invention.
Figure 2:
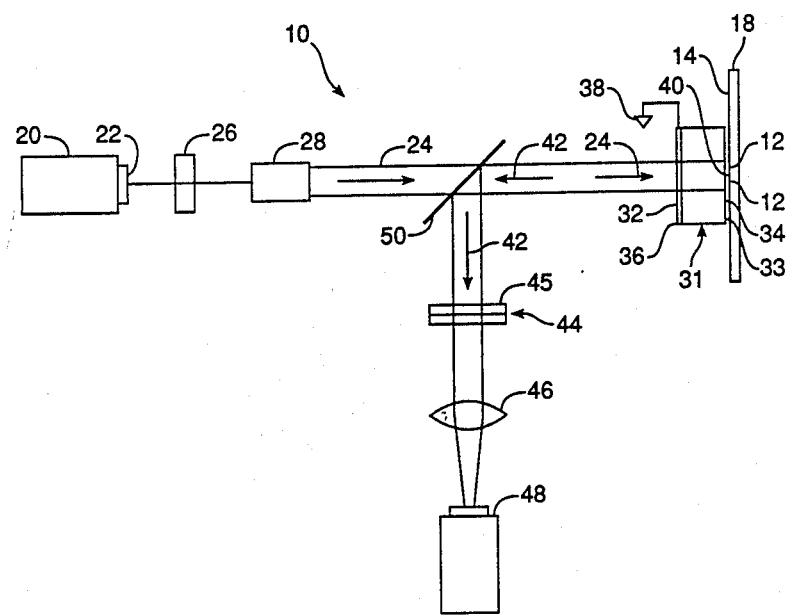
FIG. 2 is a block diagram of a second embodiment of the invention.
Figure 3:
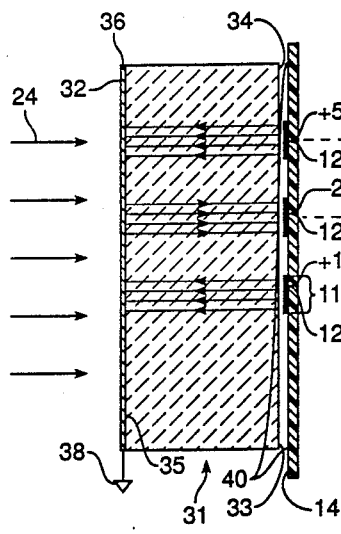
FIG. 3 is a side cross-sectional view of an electro-optic crystal adjacent a panel under test.

FIGS. 1 and 2 illustrate two embodiments of a voltage imaging system 10 or 10' for observing voltage at a large plurality of positions 12 on a surface 14 of a panel under test (PUT) 14 or 16. FIG. 3 illustrates a detail of a portion of the system 10. The PUT 14 is a panel transparent to optical energy at the wavelengths of interest and the PUT 16 is a panel which may be opaque to optical energy. The PUT 14 may be a silicon chip or the like and the PUT 16 may be a liquid crystal display (LCD) panel. In any case, the PUT 14 or 16 may be connected in some way to a source of power (not shown) in order to produce voltages at selected sites on the surface 14 of the panel 14 or 16.

In order to probe the voltage, there is first a source 20 of optical energy, such as a xenon or sodium lamp, a pulsed or continuous laser or the like. The source optical energy is channeled into a source beam 22 and processed to produce an optical input beam 24 which is polarized, expanded and collimated with a known polarization state. For this purpose, there may be provided a polarizing filter 26 or the like polarizing means and a lens, mirror or fiber optic system 28 to expand and collimate the source beam into the input beam 24. The collimated input beam preferably has a constant or at least known power density cross-section.

The input beam is directed into an electro-optic modulator means 30 or 31 of a specific type, structure and atomic or molecular axis orientation. A suitable crystal is KDP or GaAs or an encapsulated liquid crystal sandwiched between thin transparent sheets. The electro-optic modulator means 30 has a first face 32 and an opposing second face 34 in an orientation relative to the natural atomic or molecular structure of the crystal to allow longitudinal probing geometries, as explained hereinafter. The first face 32 has a conductive coating 36 which is transparent, such as indium tin oxide (ITO), and which is electrically coupled to a voltage common 38, such as ground. The second face 34 of modulator means 30 (FIG. 1) is transparent to permit transmission of the input beam through the PUT 16. The second face 34 of modulator means 31 (FIG. 2) has a highly-reflective nonconductive coating 33, which produces a retro-reflection of the input beam 24. The second face 34 is disposed to be adjacent an area 40 of the surface 14 of the PUT 16 or 18. The modulator means 30 is oriented to intercept at least a portion of the input beam 24 directed into the crystal along its natural axis through the first face 32 to impinge on the second face 34 at a position of the modulator means 30 or 31 closely adjacent the area 40 of the surface 14 of the PUT 16 or 18. The voltages at positions 12 at or near the surface 14 interact with the modulator means 30 to cause changes in the ellipticity of the input beam 24 in alignment with positions 12 of voltages. This is observable as a spatially-dependent change in collimated alignment of an output beam 42 with the input beam 24, the changes being proportional to voltages at the positions 12 on the surface 14.

The electro-optic modulator means 30 or 31 is constructed of a class of liquid or crystals which admit to a geometry for longitudinal probing. Suitable solid crystals for this geometry include class 42m (for example KDP), class 43m (for example GaAs), and point 23 group symmetries (for example BSO and BGO). The preferred crystal is KDP or deuterated KDP (DKDP), and the size is at least 2 inches (5 cm) on a side of the second face. Crystals as large as 6 to 8 inches are known but are considerably more expensive than smaller crystals.

Figure 4:
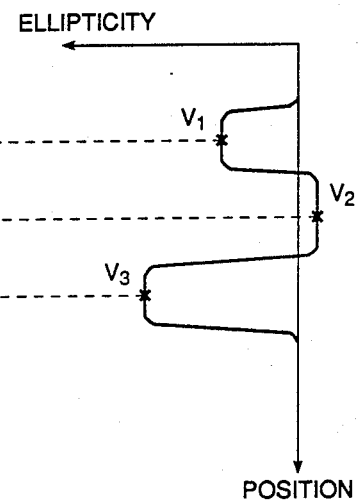
FIG. 4 is a graph of an illustrative voltage spatial distribution in connection with FIG. 3.

FIG. 4 illustrates the interaction between a PUT 18 and a modulator means 31 of a type having a reflective coating 33 on the second face 34. The reflective coating may be alumina, and an air gap or elastomeric spacer is presumed to exist between the second face 34 and the surface 14. In operation, the electric field (E-field) of each position 12 penetrates the modulator means 31 causing a change in the ellipticity of the light beam in collimated alignment with every point 12 in direct and accurate proportion to the voltage at the point 12. Voltage V1 causes a positive change in ellipticity. Voltage V2 causes a negative change in ellipticity. Voltage V3 causes a positive and extreme change in ellipticity. The ellipticity is a function of position and is directly proportional to the voltage differential between the surface 14 and the grounded conductive coating 36 on the first face of the modulator 31. The beam exiting the modulator 31, which in this example has made two passes through the crystal, therefore contains spatially modulated ellipticity (a polarization change) which carries information regarding the voltage at each point 12 relative to the reference of coating 36.

The separation between the second face 34 and the surface 14 are controlled, preferably being as close as practical without causing side effects, such as shorts, thermal transfer or mechanical distortion due to stress. The selection of the spacing is made to maximize the ratio of signal to noise, particularly noise attributable to cross-talk from electric fields produced by adjacent points of voltage. A working rule, applicable particularly to LCD panels wherein the source of voltage is an area defined as a pixel area (112 in FIG. 4), is to place the second face 34 of the modulator relative to the surface 14 at less than the distance between positions 12 and preferably no more than 30% of the diameter of the pixel area. The separation may be controlled by a mechanical positioner, such as a movable table arrangement (not shown).

In order to extract that information, means are provided for detecting the change in polarization in the image across the output beam 42 to analyze the voltages. Referring to FIGS. 1 and 2, the detectors may comprise means 44 disposed in the path of said output beam for analyzing energy of the output beam 42. The analyzing means 44 may be a further polarizing sheet. In a system where phase modulation is employed, there must be, somewhere in the path of the beam ahead of analysis, a phase retarder to impose circular polarization in order to maximize contrast. A phase retarder such as a quarter-wave plate element 45 immediately preceding the polarizing sheet, retards the energy in proportion to the spatially-dependent elliptical polarization of the energy. This imposes a spatially-dependent power modulation on the output beam proportional to voltage at corresponding positions of the surface 14. The output beam 42 is then relayed to a sensitive camera 48 through for example a focussing lens 46, which intercepts the spatially-dependent power modulation for producing as seen by the camera an observable map in two dimensions having features corresponding to voltage magnitude. Additionally, image processing can be used to enhance the ratio of signal to noise through manipulation in digitized format of the image captured by the camera 48. (Digital image manipulation is a known technique.)

In a single pass system, as shown in FIG. 1, imaging is in line. In a multiple pass system, as shown in FIG. 2, sensitivity is enhanced by passing the beam through the crystal twice. The output beam 42 is separated from the collinear input beam 24 by means of a beam splitter 50. The beam splitter 50 may also effect some polarization selection of the output beam 42. As a still further alternative, the input beam and the output beam can be separated by orienting the reflective surface 33 of the phase modulator 31 so that it is not perpendicular to the incident radiation. The output beam 42 is thus separated upon reflection, and a beam splitter is not needed.

The ratio of signal to noise can be enhanced by incorporation of an etalon means in the beam path. The etalon means is defined by parallel optically-reflective surfaces for inducing standing wave reflections within the crystal. The sensitivity increases as a function of the finesse of the etalon means. It is to be noted however that the sensitivity is a tradeoff with system bandwidth for time-resolved measurements, i.e., measurements in which the voltage on the surface varies with time and/or the source illumination is modulated on and off in order to obtain time-resolved images representative of the voltage map. In the case of the embodiment of FIG. 2 (FIG. 3), the etalon means may for example include reflective coating 33 and a further reflective coating 35 within the structure of the modulator means 31. In the case of the embodiment of FIG. 1, the etalon means may comprise surfaces of the modulator means 31, the PUT 16 and the face of retarder means 44.

The invention has now been described with reference to specific embodiments. Other embodiments will be apparent to those of ordinary skill in the art. For example, multi-quantum well electro-absorption modulators may be used, eliminating the need for conversion of phase modulation to power density conversion. Alternatively, the electro-optic modulator means could incorporate elements for direct power modulation. It is therefore not intended that this invention be limited, except as indicated in the appended claims.

What is claimed is:

1. An apparatus for observing voltage at a large plurality of positions on a surface of a panel under test comprising:
   means for producing optical energy;
   means for expanding, collimating and polarizing said optical energy into an input beam of known polarization state;
   an electro-optic modulator means, said electro-optic modulator means having a first face and an opposing second face in an orientation to allow longitudinal probing geometries, said first face having a conductive coating electrically coupled to a voltage common and said second face being disposed to be adjacent an area of said surface of said panel under test, said modulator means being oriented to intercept at least a portion of said input beam directed into said modulator means through said first face to impinge on said second face adjacent said area of said surface in order to cause in an output beam spatially-dependent modulation along said input beam, said modulation being proportional to voltages at positions on said surface; and
   means for detecting said modulation in an image across said output beam to analyze voltages on said surface.

2. The apparatus according to claim 1 wherein said electro-optic modulator means is transmissive of said output beam through said surface and said surface is transmissive of said output beam such that optical energy passes only once through said electro-optic modulator means.

3. The apparatus according to claim 1 wherein said second face of said electro-optic modulator means has an optically reflective coating such that said input beam and said output beam each pass through said electro-optic modulator means, further including means for separating said output beam from said input beam.

4. The apparatus according to claim 3 wherein said input beam and said output beam are collinear, and said separating means is a beam splitter.

5. The apparatus according to claim 1 wherein separations between said positions is greater than separation between said surface and said second face in order to minimize cross-talk between electric fields produced by voltages at said positions.

6. The apparatus according to claim 1 wherein said modulation is phase modulation and wherein said detecting means comprises:
   means disposed in the path of said output beam for retarding energy of said output beam in proportion to spatially-dependent elliptical polarization of said energy in order to impose a spatially-dependent power modulation proportional to voltage at corresponding positions of said surface; and
   means disposed behind said retarding means to intercept said spatially-dependent power modulation for analyzing said retarded energy; and
   means for producing an observable map having features corresponding to voltage magnitude.

7. The apparatus according to claim 6 wherein said map producing means is a camera.

8. The apparatus according to claim 1 further including etalon means defined by parallel optically-reflective surfaces for inducing standing wave reflections to increase the ratio of signal to noise.

9. The apparatus according to claim 1 wherein said electro-optic modulation means is a crystal.

10. The apparatus according to claim 9 wherein said second face of said electro-optic modulator means has an optically reflective coating such that said input beam and said output beam each pass through said electro-optic modulator means, further including means for separating said output beam from said input beam and wherein said separating means is a beam splitter for splitting polarized optical energy.

11. The apparatus according to claim 9 wherein separations between said positions is greater than separation between said surface and said second face in order to minimize cross-talk between electric fields produced by voltages at said positions.

12. The apparatus according to claim 9 further including etalon means defined by parallel optically-reflective surfaces for inducing standing wave reflections to increase the ratio of signal to noise.

13. The apparatus according to claim 1 wherein said electro-optic modulation means is a liquid crystal.

14. The apparatus according to claim 1 wherein said electro-optic modulation means is a solid crystal.

15. The apparatus according to claim 14 wherein said solid crystal is formed of KDP.

16. The apparatus according to claim 14 wherein said solid crystal is formed of DKDP.

17. An apparatus for simultaneously observing voltage at a plurality of positions on a surface of a panel under test comprising:
   a light source for producing optical energy;
   a polarizing element for polarizing said optical energy in a source beam to a known polarization state;
   a lens system for expanding and collimating said source beam into an input beam of known polarization state;
   an electro-optic modulator means, said electro-optic modulator means having a first face and an opposing second face in an orientation to allow longitudinal probing geometries, said first face having a conductive coating electrically coupled to a voltage common and said second face being disposed to be adjacent an area of said surface of said panel under test, said modulator means being oriented to intercept at least a portion of said input beam directed into said modulator means through said first face to impinge on said second face adjacent said area of said surface in order to cause in an output beam spatially-dependent change in polarization along said input beam, said change in polarization being proportional to voltages at positions on said surface;

means disposed in the path of said output beam for analyzing energy of said output beam in proportion to spatially-dependent elliptical polarization of said energy in order to impose a spatially-dependent power modulation proportional to voltage at corresponding positions of said surface; and means disposed to intercept said spatially-dependent power modulation for producing an observable map having features corresponding to voltage magnitude to analyze voltages on said surface.

18. The apparatus according to claim 17 wherein said electro-optic modulator means is transmissive of said output beam through said surface and said surface is transmissive of said output beam such that optical energy passes only once through said electro-optic modulator means.

19. A method for observing voltage at a large plurality of positions on a surface of a panel under test comprising:

directing an expanded, collimated and polarized input beam of optical energy of known polarization state into an electro-optic modulator means, said electro-optic modulator means having a first face and an opposing second face in an orientation to allow longitudinal probing geometries, said first face having a conductive coating electrically coupled to a voltage common and said second face being disposed to be adjacent an area of said surface of said panel under test, said electro-optic modulator means being oriented to intercept at least a portion of said input beam directed into said modulator means through said first face to said second face adjacent said area of said surface of said panel under test in order to cause in an output beam a spatially-dependent modulation along said input beam, said modulation being proportional to voltages at positions on said surface; and detecting said modulation in an image across said output beam to analyze voltages on said surface.

20. The method according to claim 19 wherein said modulation is phase modulation and wherein said detecting step comprises:

retarding energy of said output beam in proportion to spatially-dependent elliptical polarization of said energy;

analyzing energy of said output beam in proportion to spatially-dependent elliptical polarization of said in order to impose a spatially-dependent power modulation proportional to voltage at corresponding positions of said surface; and producing from said spatially-dependent power modulation an observable map having features corresponding to voltage magnitude.

* * * * *